United States Patent
Correia et al.

(12)

(10) Patent No.: US 6,279,815 B1
(45) Date of Patent: Aug. 28, 2001

(54) STACKED CHIP PROCESS CARRIER

(75) Inventors: George C. Correia, Warrenton, VA (US); John E. Cronin, Milton; Edmund J. Sprogis, Underhill, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/621,561

(22) Filed: Jul. 21, 2000

Related U.S. Application Data

(62) Division of application No. 09/098,828, filed on Jun. 17, 1998, now Pat. No. 6,213,376.

(51) Int. Cl.⁷ .......................... B23K 31/02; B23K 37/04
(52) U.S. Cl. ............................... 228/180.21; 228/180.22; 228/49.5
(58) Field of Search ...................... 228/179.1, 180.1, 228/180.21, 180.22, 44.7, 49.1, 49.5; 29/281.5; 269/287, 903; 156/60, 349, 381

(56) References Cited

U.S. PATENT DOCUMENTS

| | | |
|---|---|---|
| 3,610,612 | 10/1971 | Day . |
| 3,617,045 * | 11/1971 | Da Costa et al. . |
| 3,849,857 | 11/1974 | Murray, Jr. . |
| 3,920,295 | 11/1975 | Speckin . |
| 4,473,455 | 9/1984 | Dean et al. . |
| 4,703,920 | 11/1987 | Grabbe et al. . |
| 4,804,130 | 2/1989 | Kwan et al. . |
| 4,993,895 | 2/1991 | Nordstrom . |
| 5,034,802 | 7/1991 | Liebers, Jr. et al. . |
| 5,060,846 | 10/1991 | Schaeffer et al. . |
| 5,219,794 * | 6/1993 | Satoh et al. . |
| 5,332,463 | 7/1994 | Eberlein et al. . |
| 5,372,296 * | 12/1994 | Konecke et al. . |
| 5,431,331 | 7/1995 | Ney et al. . |
| 5,460,320 | 10/1995 | Belcher et al. . |
| 5,563,444 | 10/1996 | Leroux et al. . |
| 5,578,527 | 11/1996 | Chang et al. . |
| 5,632,434 * | 5/1997 | Evans et al. . |
| 5,766,972 * | 6/1998 | Takahashi et al. . |
| 5,766,975 * | 6/1998 | Templeton, Jr. et al. . |
| 5,907,474 * | 5/1999 | Dolbear . |
| 6,158,650 * | 12/2000 | Holzmann . |

* cited by examiner

*Primary Examiner*—Tom Dunn
*Assistant Examiner*—Kiley Stoner
(74) *Attorney, Agent, or Firm*—Scully, Scott, Murphy & Presser; Robert A. Walsh, Esq.

(57) ABSTRACT

The present invention provides an apparatus and methods for holding a first semiconductor device in proper alignment to a second semiconductor device, whose size is different from the first device, while performing a C4 bond between the two devices. The apparatus for holding the two devices in proper alignment consists of a holding fixture, which includes upper and lower pocket receptacles for receiving the semiconductor devices. The semiconductor devices are placed into the respective upper and lower slots aligned to two or more edges of the holding fixture.

11 Claims, 7 Drawing Sheets

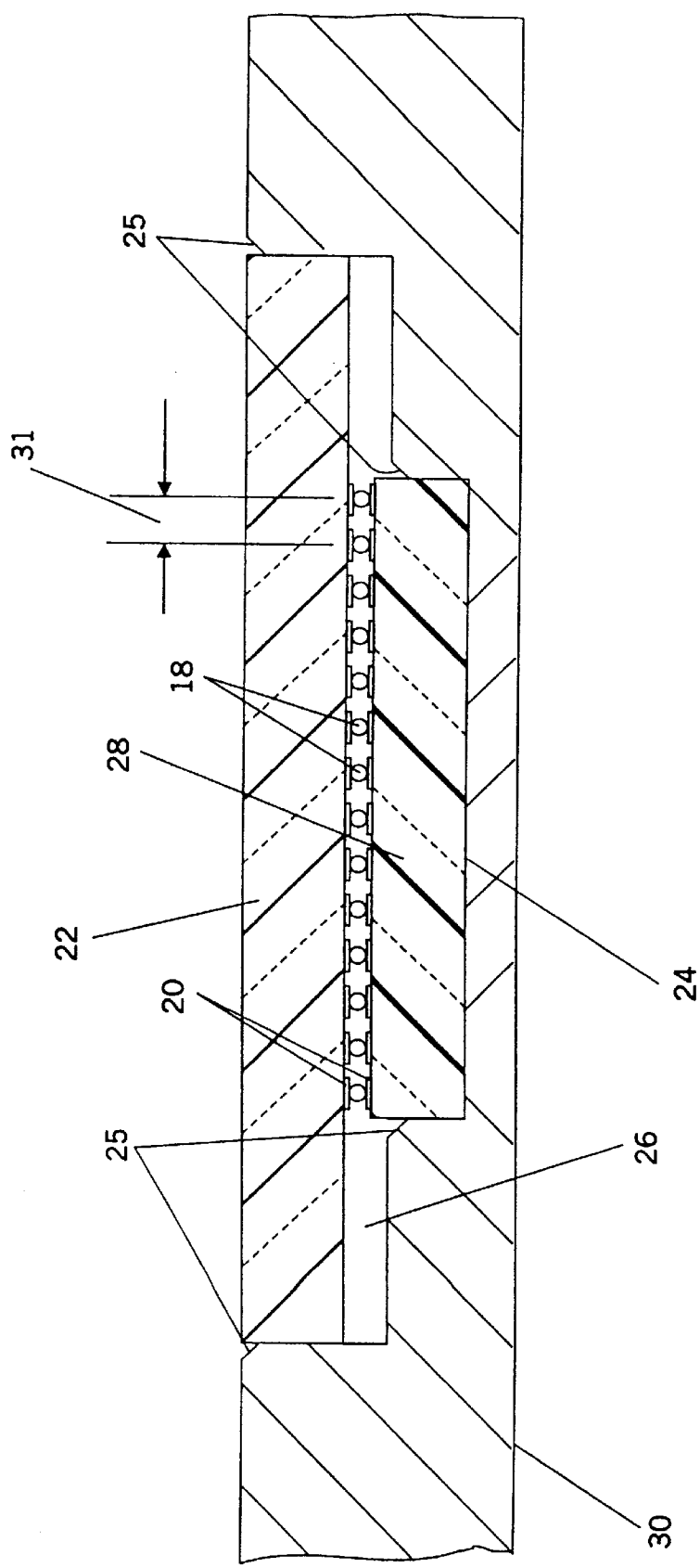

STACKED CHIP PROCESS CARRIER

RELATED APPLICATION

This application is a divisional of U.S. application Ser. No. 09/098,828 now U.S. Pat. No. 6,213,376, filed Jun. 17, 1998.

BACKGROUND OF THE INVENTION

1. Field of the Invention

This invention relates generally to workpieces and manufacturing methods used during soldering procedures. More particularly, the invention addresses a method and apparatus to hold in proper alignment two or more semiconductor devices during the bonding operation.

2. Discussion of the Prior Art

Processes for direct chip attachment (DCA) of semiconductor IC's to substrates are known, and are being used extensively in the industry. A key feature of the technique is the fabrication of minute solder balls or "bumps" on the semiconductor die with a process similar to that described in U.S. Pat. Nos. 3,401,126 and 3,429,0401 known as C4 for Controlled Collapse Chip Connection. Attaching the "bumped" die to a suitable substrate is achieved by applying a flux to either the die or substrate surface, aligning the two components usually with optical image recognition systems, placement to achieve contact, and reflow, which is the joining of the interconnect in a high temperature furnace Currently, in the push to achieve ever-higher integration levels, there is impetus to use C4 interconnection directly between two or more semiconductor die to create a stacked component which is then mounted onto a suitable carrier such as a substrate using wirebonds. Such an assembly would fulfill a long standing need of merging many different semiconductor technologies (i.e. LOGIC, DRAM, BICMOS, SiGe, GaAs) together easily while allowing extremely high bandwidth between the individual die owing to the high density and low capacitance loading of die-to-die C4 interconnects. However, the conventional C4 joining process described above poses problems when applied to the direct joining of individual dies. In the conventional die-to-substrate attach procedure, the substrate is always larger, and typically very much larger, than the die. This size difference facilitates the application of flux since it can be easily applied only to the region where the die will attach, and does not cover other surfaces which would cause it to stick to the process fixturing. In contrast, for die-to-die attachment, both components are generally small and close to the same physical size which makes it difficult to contain the flux to only the joining surface during apply and reflow. Furthermore, if flux is used in the die-to-die attach procedure, it usually will cover the metal pads used for wirebond connections later in the assembly process. Since flux is difficult to clean without leaving some trace residuals, problems with the wirebond connection may result. Finally, stacked die configurations are envisioned where a smaller die straddles two or more larger die. The relatively loose placement tolerances of the substrate in the die-to-substrate attach procedure would preclude its successful application to die-to-die attachment. The present widely used methods for the direct chip attachment (DCA) of semiconductor IC's to substrates are inconvenient, costly and time consuming and do not not adequately address present requirements. It would therefore be extremely advantageous to provide a simple cost effective solution which achieves the aforestated objectives.

SUMMARY OF THE INVENTION

The object of the present invention is to provide an apparatus that eliminates or reduces disadvantages associated with conventional holding apparatus.

Another object of the present invention is to provide an apparatus having reasonable manufacturing costs.

Yet another object of the present invention is to provide an apparatus for aligning two or more discrete semiconductor devices without the need for fixturing tools for alignment.

A still further object of the present invention is to provide an apparatus that does not put pressure or stress on the semiconductor devices to be bonded.

Yet another object of the present invention is to provide a method that does not require flux or the complications of flux processing.

A further object of the present invention is to provide an apparatus that allows for any shape of chip (die) to be bonded without the need for a chip carrier designed for each chip set size variation.

These and other objects of the present invention are achieved by a stacked chip process and apparatus that holds in proper alignment two or more semiconductor devices of different sizes for the purpose of solder bonding. The apparatus contains two slots, a bottom slot machined to accept a wide range of smaller semiconductor devices, and a topslot machined to accept a wide range of larger semiconductor devices, where the top slot is larger than and coincident with the bottom slot. A smaller die is placed in the holder on its vertical face, aligned to at least two sides of the apparatus. A larger die is placed face down over the smaller die in the top slot. Either die may have the solder bumps predefined on it, whereas the opposite die has the metal pads and possibly even a small amount of solder. The apparatus is then placed into an anneal flow cycle.

BRIEF DESCRIPTION OF THE DRAWINGS

Reference may now be had to the following detailed description of preferred embodiments of the invention, taken in conjunction with the accompanying drawings; in which;

FIG. 2 illustrates a cross-sectional view of the holding apparatus;

DESCRIPTION OF THE PREFERRED EMBODIMENTS

Figure 1A:
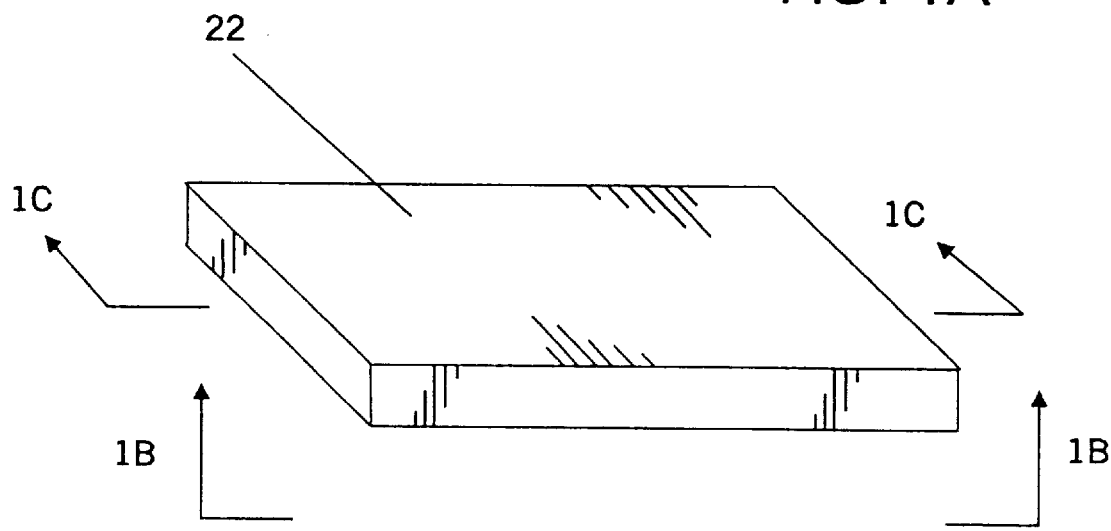
FIGS. 1a–1d illustrate respective top, bottom and cross-sectional views of an IC semiconductor device shown with both attachment orientations, solder bonding pads and solder balls.
Figure 1B:
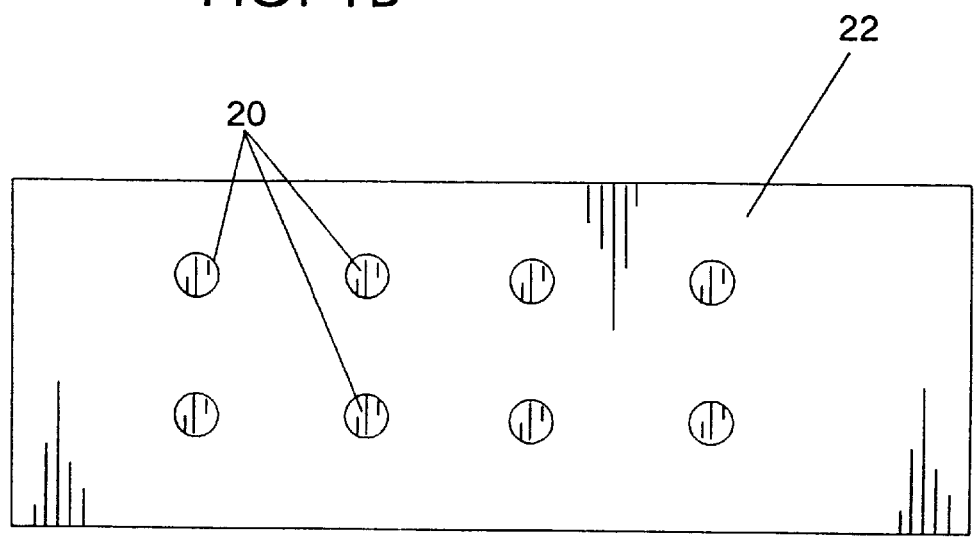
Figure 1C:
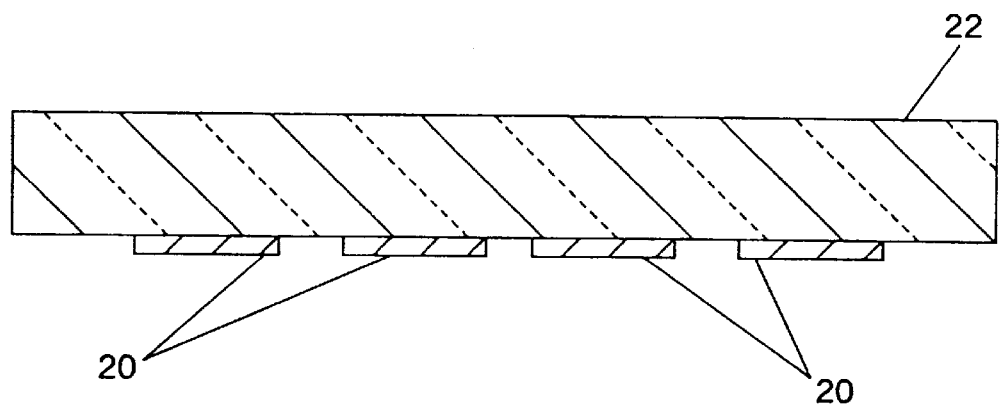
Figure 1D:
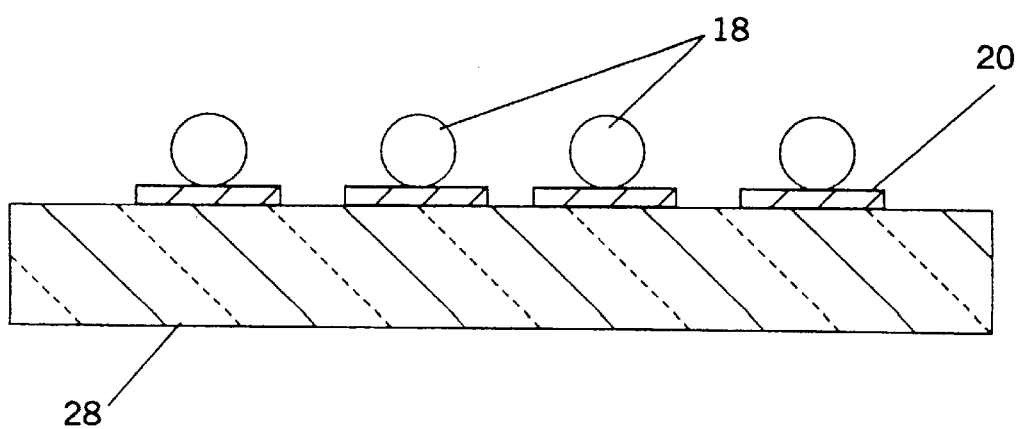

The preferred embodiments of the present invention and its advantages are best understood by referring to FIGS.1, 2, 3, 4 and 5 of the drawings.

FIG. 1 illustrates the semiconductor device to be bonded. FIGS. 1C and 1D illustrate that one of the two devices to be bonded will have the solder balls predefined on its vertical face, FIG. 1D, and the other die will have the metal solder bonding pads, FIG. 1C.

Referring now to FIG. 2 there is illustrated a vertical cross-sectional view of the holding apparatus 30. In the preferred embodiment the fixture 30 includes a vertical surface of the apparatus having a cavity with a first stepped portion defining a bottom pocket 24 for accepting a smaller IC semiconductor device, Die 'A' 28, and a second stepped portion defining a top pocket 26 for accepting a larger IC semiconductor device, Die 'B' 22 in a manner substantially overlying the bottom pocket. The top and bottom pockets are oriented such that the dies, when deposited into the respective pocket portions, are oriented face to face with the solder balls 18 adhered to one of the dies, being aligned with the corresponding metal pads 20 of the other die. The bottom pocket 24 is machined to accept a wide range of sizes of the smaller dies, whereas the top pocket 26 is machined to accept a wide range of sizes of the larger dies. The smaller die 28 is placed in the lower pocket 26 and the larger die 22 is placed face down over the smaller die 28 in substantially overlapping relation as shown in FIG. 2 in the holder 30. Either die may have the solder balls 18 predefined on its vertical face, and the opposite die would then have the metal pads and possibly even a small amount of solder.

Figure 3A:
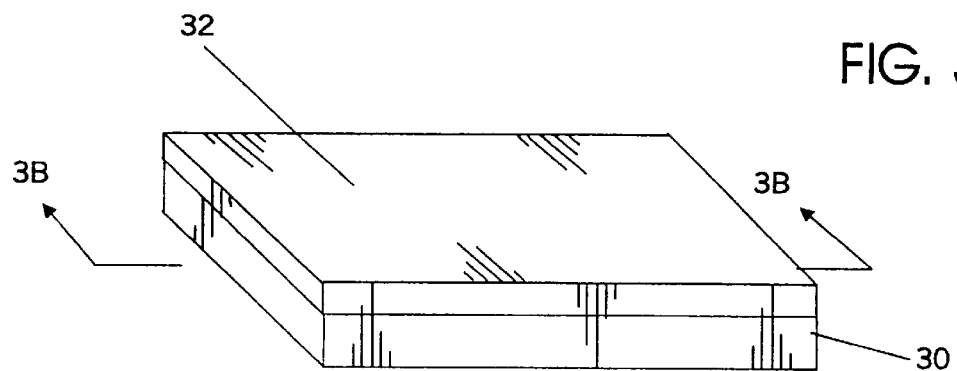
FIGS. 3a–3c illustrates the holding apparatus as shown in FIG. 2 but with spacer elements for varying die sizes.
Figure 3B:
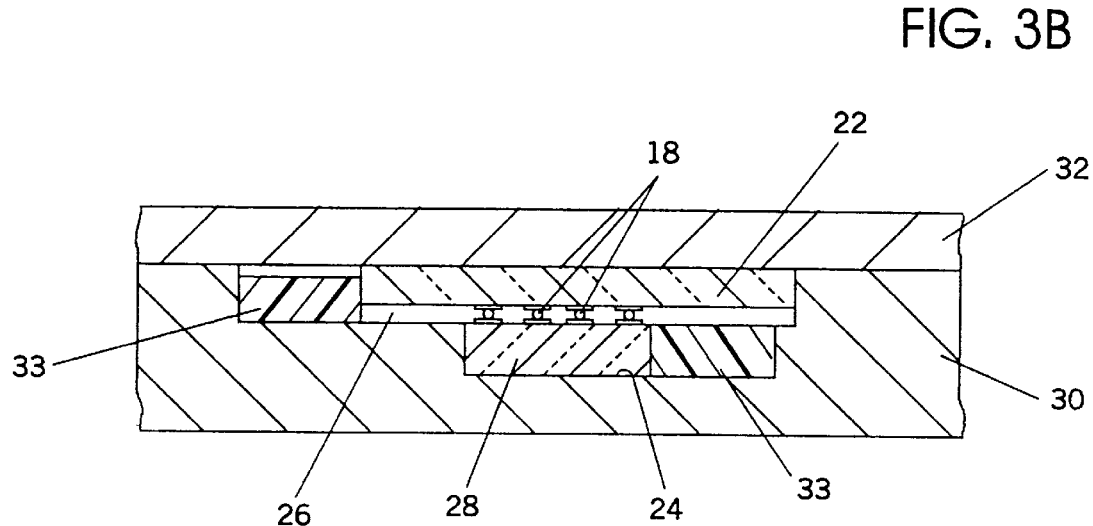
Figure 3C:
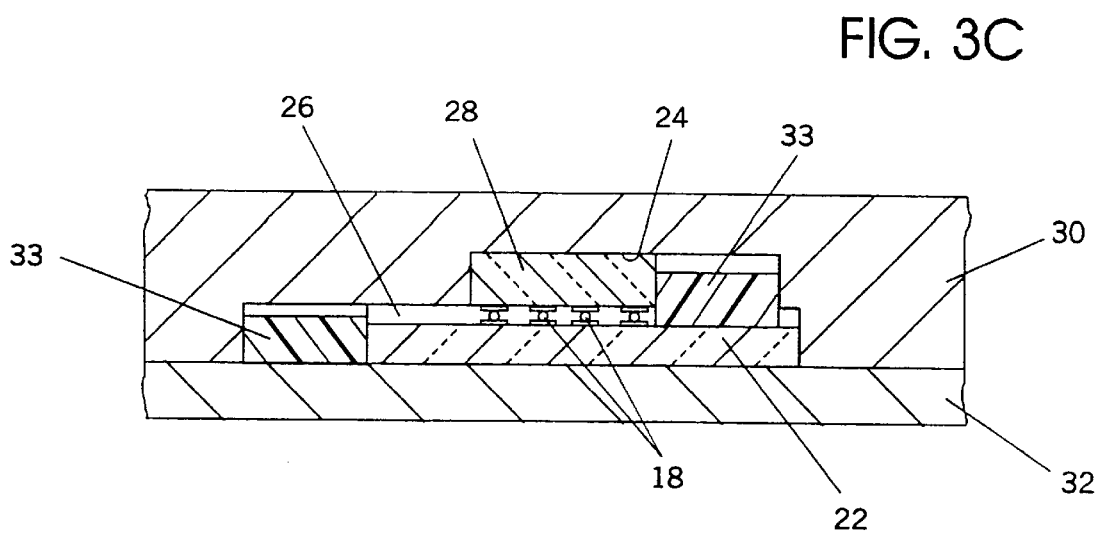

FIGS. 3a–3c illustrate the utilization of a dummy die 32 preplaced in the bottom pocket 24 and a dummy die 30 in the top pocket 26 so that both the smaller die 28 and the larger die 22 may be fixed into a predefined position.

Proper alignment of the two semiconductor devices depends upon the vertical faces in the pockets. There are two tolerances that contribute to misalignment; die dimension tolerance and pocket dimension tolerance. These combined tolerances must be less than the size of the interconnect pad.

Referring to FIG. 2, the periodicity 31 of the solder bumps 18 is on the order of 250 microns. This figure also defines the size of the associated interconnect pad. In order to achieve proper alignment the tolerance between the die pad and the bond edge must be less one half of the periodicity of the solder bumps to within an accuracy of +/−5 microns. Assuming that one half the pitch of the solder balls is on the order of 125 microns, the cumulative tolerance mismatches must be less than 125 microns +/−5 microns to meet the overall tolerance requirements. The tolerance mismatches sources include 1)thermal mismatches between die and apparatus, 2) die manufacturing tolerances, and 3) machining tolerances of the fixture edge. Each tolerance mismatch will be described in detail.

Thermal tolerance mismatches arise from differences in the thermal coefficient of expansion (TCE) between the fixture and the semiconductor device (die). In a preferred embodiment the fixture is fabricated of a material with a thermal coefficient of expansion (TCE) which most closely matches the (TCE) of the dies to be bonded. Materials such as Kovar, invar, and tungsten, or alloys thereof, have TCE's that are most closely matched to the TCE of the IC's. TCE mismatches for closely matched materials are of the general order of 10 microns. The second source of tolerance mismatch, die manufacturing tolerance mismatches, arise from the manufacturing tolerances associated with the production of the dies. Current manufacturing techniques provide die dicing tolerances on the order of +/−5 microns. A third source of tolerance mismatch arises from the machined tolerance of the fixture edge.

Thus, the allowable tolerances in constructing pockets of the fixture edge is governed in accordance with Equation 1 which describes the overall tolerance mismatch attributable to the previously described sources. Specifically, Equation 1 states that the total allowable tolerance mismatch is defined by one half the periodicity of the solder bump spacing, 125 microns +/−5 microns. The right hand side of the equation define those tolerance mismatches, which when summed must be less than or equal to the total allowance.

SUM (tolerance mismatches)<=[½ solder bump spacing +/−5 u] [Eq.1]

Where the SUM (tolerance mismatches)=machined edge tolerance
+die tolerance
+TCE mismatch tolerance.

Given that the generally acceptable range of IC die tolerances is on the order of +/−5 microns and further considering that TCE mismatch tolerances to be on the order of 10 microns leaves an allowable fixture tolerance on the order of 100 microns. Machine tolerances on the order of 100 microns represent easily buildable manufacturing tolerances. Clearly, the combined tolerances of fixture locating edge machining, die edge machining, die edge dimensions, and die freeplay in the fixture are smaller than what is required for adequate die-to-die alignment for reflow.

Figure 4A:
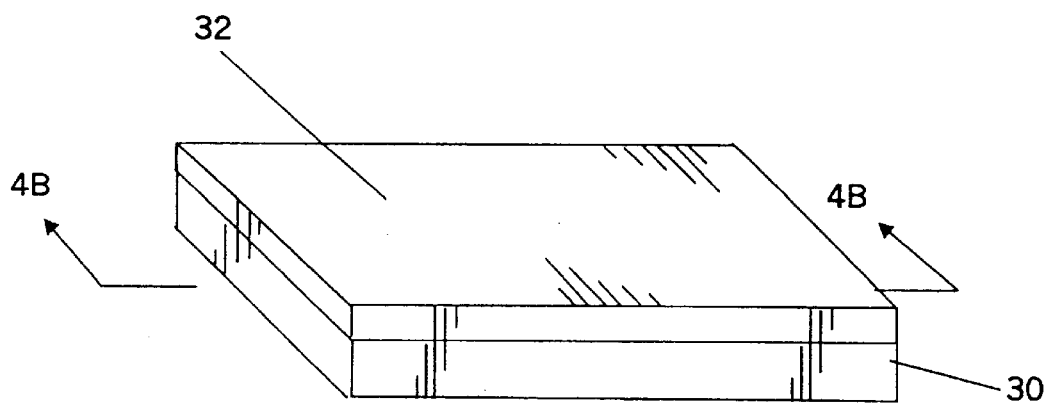
FIG. 4 illustrates an alternate embodiment of the holding apparatus as shown in FIG. 2 with a top plate to facilitate inverting the apparatus.
Figure 4B:
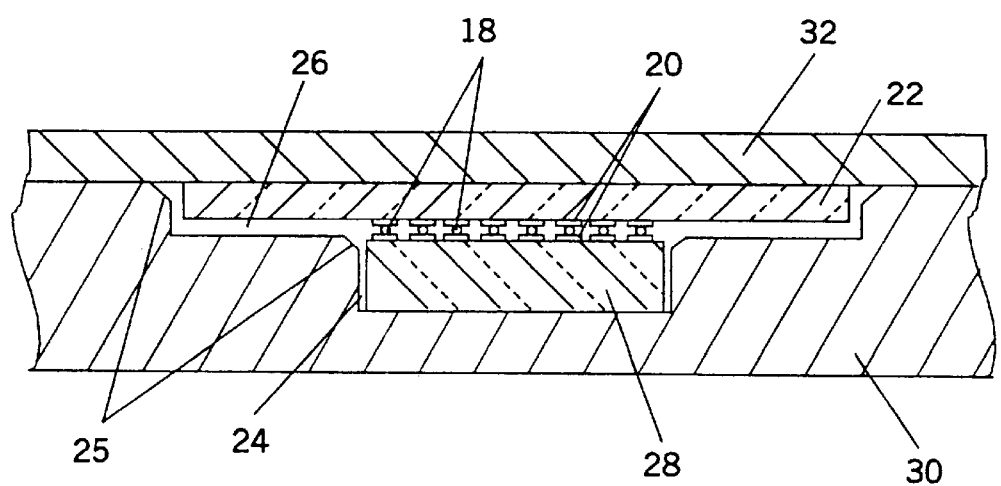
Figure 4C:
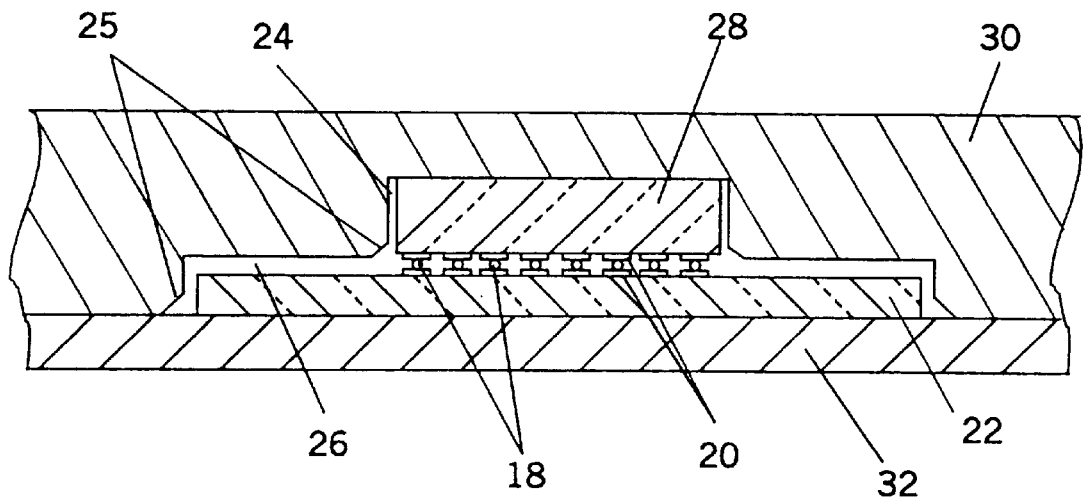

FIG. 4 illustrates a second embodiment of the holding apparatus for those situations where two dies of significantly different sizes are to be bonded. In those situations the pressure placed on the solder bonds would not be evenly distributed if inserted in the fixture of FIG. 2. A solution to this situation is described by FIG. 4 which illustrates a second plate 32 that would be placed on top of the apparatus 30 after the dies 22 and 28 have been placed inside the respective pockets 24 and 26. The entire unit would then be turned upside down as shown in FIG. 4c. Turning the apparatus has the effect of evening out the pressure on the solder balls.

Figure 5A:
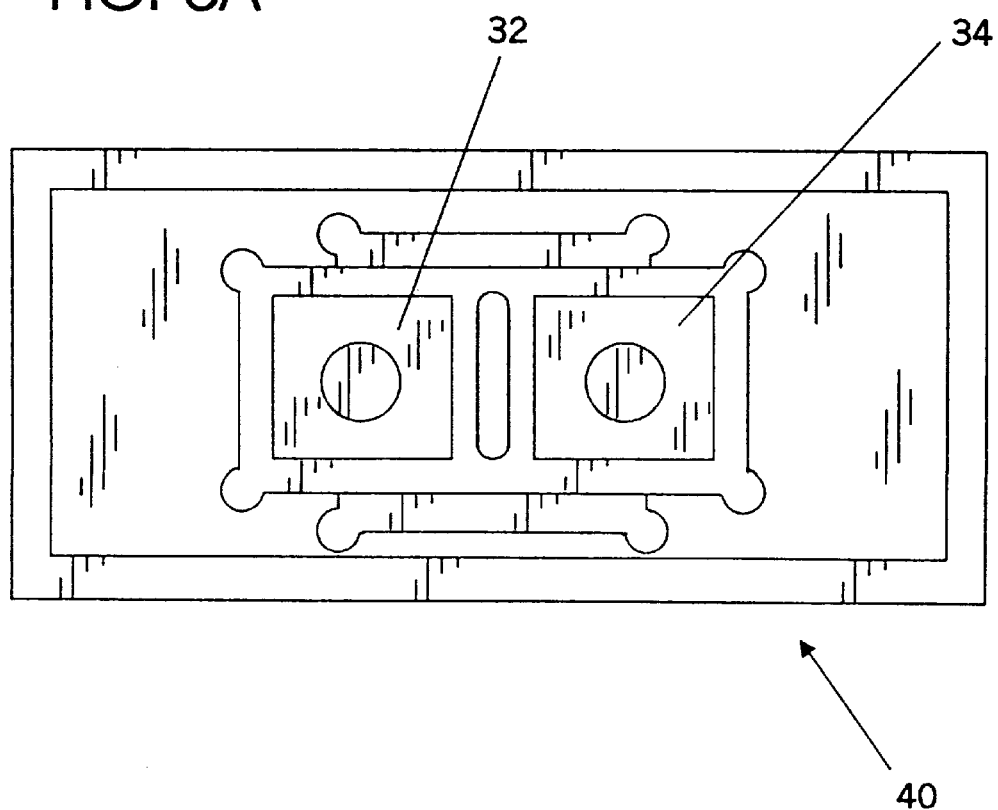
FIG. 5 illustrates an alternate embodiment of the holding apparatus for bonding a smaller die to two or more larger die.
Figure 5B:
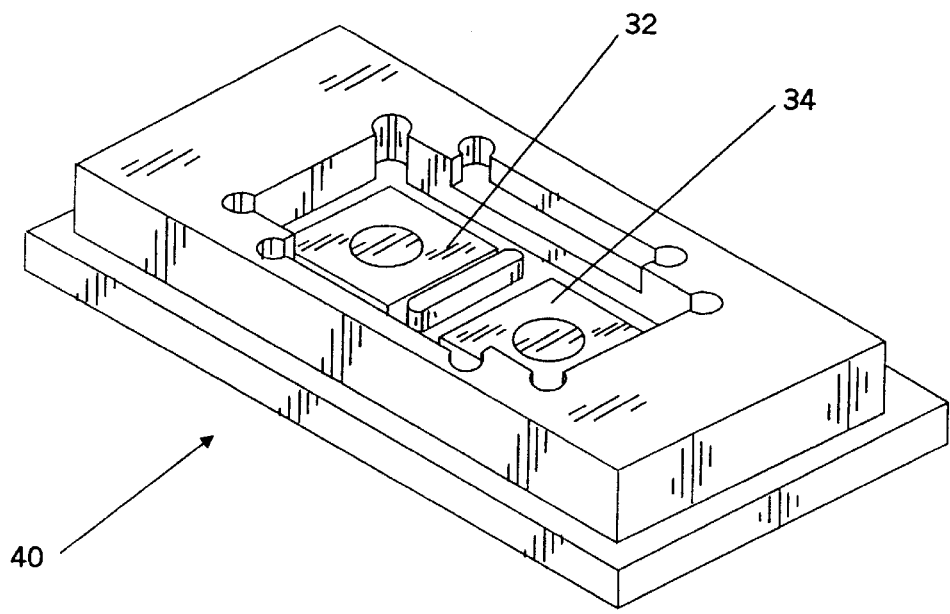
Figure 5C:
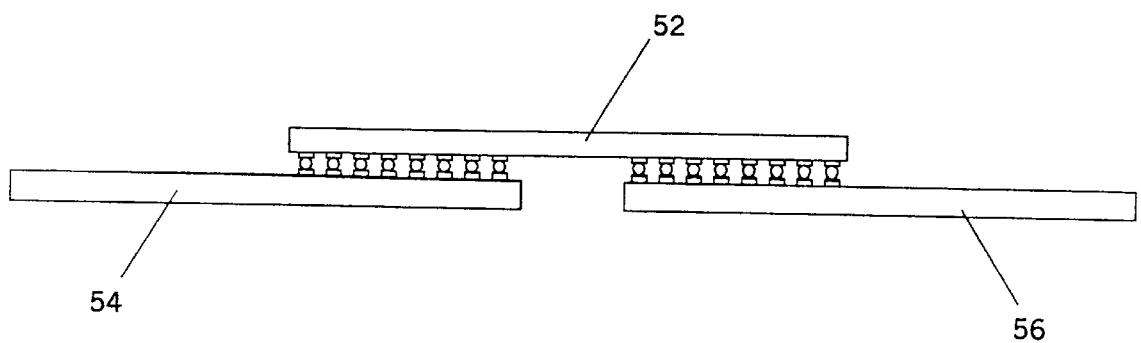

FIG. 5 depicts a third embodiment of the holding apparatus 40 for those situations where it is desired to bond a smaller die 52 to two larger dies 54 and 56. The apparatus 40 would have a cavity with a first stepped portion defining two adjacent bottom pockets 32 and 34 for accepting two smaller IC semiconductor dies 54 and 56. Placement and orientation of the respective dies would proceed in a manner similar to that described in FIG. 2.

In a preferred embodiment of the present invention, all fixture edges would be chamfered 25 to minimize potential damage to an IC. To further prevent any potential damage to an IC, the bottom inside corner of the apparatus 30 contains a groove to accommodate a pointed die edge. In a preferred embodiment the apparatus 30 would also be drilled wherever feasible to reduce the thermal mass of the fixture. Since the contact points are small relative to the apparatus, the reflow operation would be accelerated.

In a preferred embodiment the two semiconductor dies would be joined in the manner shown in FIG. 2 without the use of flux in a reducing atmosphere such as H2.

While only particular embodiments of the invention have been shown and described herein, it will be obvious that additional modifications may be made without departing from the spirit of this invention. Still, it is not intended that this invention be limited, except as indicated by the appended claims.

Having thus described our invention, what we claim as new, and desire to secure by Letters Patent is:

1. A method of joining a first semiconductor device and a second semiconductor device in a fixture having a lower pocket and an upper pocket, wherein the upper pocket is aligned to the lower pocket, the method steps comprising:
  a) providing the first device in the lower pocket;
  b) aligning the first device to the lower pocket on at least two sides;
  c) providing the second device in the upper pocket;
  d) aligning the second device to the upper pocket on at least two sides;
  e) joining the first device to the second device.

2. The method of claim 1, wherein step d further comprises inverting the fixture.

3. The method of claim 1, wherein step e further comprises joining the first device to the second device with solder at a temperature to allow reflow of the solder.

4. The method of claim 1, wherein said steps b and d further comprise aligning along two straight edges.

5. The method of claim 1, wherein aligning said first and second devices is performed on four sides.

6. The method of claim 1, wherein the alignment of the lower pocket to the upper pocket is symmetrical.

7. The method of claim 1 wherein said first and second devices further comprise metallic pads of a defined width, said metallic pads of said first and second devices being joined together by solder balls.

8. The method of claim 1 wherein step e further comprises joining the first device to the second device in a $H_2$ atmosphere.

9. The method of claim 1, wherein the second device is asymmetrically arranged over the first device.

10. The method of claim 1, wherein the fixture is fabricated of Kovar, Invar or tungsten.

11. The method of claim 1, wherein a first semiconductor device is joined to a second and third semiconductor device, the apparatus comprising:

a plate including a cavity having first and second pockets formed therein in substantially overlapping manner, said first pocket of first depth dimension further comprising two adjacent sections for accommodating the placement of said second and third semiconductor devices in a first orientation and said second pocket of second depth dimension for accommodating placement of a first semiconductor device in a second orientation.

* * * * *

UNITED STATES PATENT AND TRADEMARK OFFICE
CERTIFICATE OF CORRECTION

PATENT NO. : 6,279,815 B1
DATED : August 28, 2001
INVENTOR(S) : George C. Correia et al.

Page 1 of 1

It is certified that error appears in the above-identified patent and that said Letters Patent is hereby corrected as shown below:

<u>Column 4,</u>
Line 1, "+/-5..." should read -- +/-5 um]. --

Signed and Sealed this

Thirtieth Day of April, 2002

*Attest:*

*Attesting Officer*

JAMES E. ROGAN
*Director of the United States Patent and Trademark Office*